United States Patent [19]
West et al.

[11] Patent Number: 5,106,723
[45] Date of Patent: Apr. 21, 1992

[54] CONTRAST ENHANCEMENT LAYER COMPOSITIONS, ALKYLNITRONES, AND USE

[75] Inventors: Paul R. West, Ballston Spa; Gary C. Davis, Albany; Karen A. Regh, Clifton Park, all of N.Y.

[73] Assignee: MicroSi, Inc., Phoenix, Ariz.

[21] Appl. No.: 638,694

[22] Filed: Jan. 8, 1991

Related U.S. Application Data

[62] Division of Ser. No. 445,914, Dec. 4, 1989, Pat. No. 5,002,993.

[51] Int. Cl.$^5$ .............................................. G03C 1/727
[52] U.S. Cl. ................................. 430/325; 430/156; 430/273; 430/339; 430/928; 564/248; 564/278; 568/924; 568/927; 568/943; 524/236; 524/500

[58] Field of Search ............... 430/339, 325, 928, 273, 430/156; 564/248, 278; 568/924, 927, 943; 524/236, 500

[56] References Cited

U.S. PATENT DOCUMENTS

| | | | |
|---|---|---|---|
| 3,416,922 | 12/1968 | Süs | 430/270 |
| 4,677,049 | 6/1987 | Griffing et al. | 430/339 |
| 5,002,993 | 3/1971 | West et al. | 524/236 |

Primary Examiner—Charles L. Bowers, Jr.
Assistant Examiner—Thorl Chea
Attorney, Agent, or Firm—Davis Hoxie Faithfull & Hapgood

[57] ABSTRACT

Contrast enhancement compositions are provided which can be used to make contrast enhancement layer photoresist composites. The composites can be used to make patterned photoresists under mid-UV light and utilize photobleachable alkylnitrones.

7 Claims, No Drawings

CONTRAST ENHANCEMENT LAYER COMPOSITIONS, ALKYLNITRONES, AND USE

"This is a divisional of copending application(s) Ser. No. 07/445,914 filed on Dec. 4, 1989, now U.S. Pat. No. 5,002,993".

BACKGROUND OF THE INVENTION

Prior to the present invention as shown by the copending application of Griffing et al., Ser. No. 675,915, filed Nov. 28, 1984, for SPIN CASTABLE PHOTOBLEACHABLE LAYER FORMING COMPOSITIONS, assigned to the same assignee as the present invention and incorporated herein by reference, diarylnitrones were utilized in combination with inert organic polymer binders to make contrast enhancement layer-forming compositions. Although the diarylnitrone photobleachable layer-forming compositions of Griffing, et al. have been found to be valuable materials for use in near UV (350–450 nm) contrast enhanced lithography, recent interest has developed in developing photoresists for use in the mid-UV imaging areas such as 300–350 nm. It has been found that, although arylnitrones can be totally bleached under mid-UV light, the diaryloxaziridines are somewhat absorbant towards mid-UV light and undergo secondary photochemical reactions. As a result, diarylnitrone-based contrast enhancing formulations are generally used in near-UV photolithography. For example, simple diarylnitrones such as $\alpha$, N-diphenylnitrone ($\lambda$313 nm, $\epsilon$=22,000 L/mole cm), or $\alpha$-anisyl-N-phenylnitrone ($\lambda$329 nm, $\epsilon$=23,000 L/mole cm) absorb in the desired regions and also appear to bleach efficiently in dilute solutions. However, when cast in films of a copolymer such as styrene and allyl alcohol, the films exhibit poor bleaching characteristics. Thus, the films initially bleach rapidly, but after reaching a transmission maximum of 60% or less, transmission can fall off rapidly if photolysis is continued. One possible explanation is that the absorption spectrum of the oxaziridine photoproduct tails sufficiently into the 300 nm region to undergo secondary photochemical reactions. It is desirable, therefore, to find nitrone systems having suitable spectral characteristics which do not undergo secondary reactions under the applied illumination conditions.

The present invention is based on our discovery that $\alpha$-aryl-N-alkylnitrones and dialkylnitrones, as defined hereinafter, possess spectral and photochemical properties which make them particularly well suited for use as contrast enhancement materials for mid-UV (300–365 nm) applications. It has been further found that when these alkylnitrones are formulated with certain inert organic polymers in the presence of a solvent such as water, a water soluble organic solvent, a mixture of water and such water soluble organic solvent, or a water immiscible organic solvent, spin castable mixtures can be made which are suitable for forming in situ, a photobleachable contrast enhancement layer (CEL) on the surface of a photoresist. It has been further found that a suitable organic solvent can be used to strip the photobleached (CEL) from the photoresist surface when a water insoluble inert organic polymer is used in the spin castable mixture. Alternatively, total removal of the CEL also can be achieved simultaneously during development of the photoresist under aqueous conditions when a water soluble inert organic binder is used.

STATEMENT OF THE INVENTION

There is provided by the present invention, spin castable contrast enhancement layer (CEL) compositions which comprise, by weight, (A) 100 parts of solvent,
(B) 1 to 30 parts of inert organic polymer binder, and
(C) 1 to 30 parts of alkylnitrone selected from the class consisting of arylalkylnitrones and dialkylnitrones.

An additional aspect of the present invention is directed to composites useful for making patterned photoresists using mid-UV irradiation, comprising a photoresist and a contrast enhancement layer formed in situ thereon, where the contrast enhancement layer is made from a spin castable mixture comprising the above-described spin castable CEL compositions.

A further aspect of the present invention is directed to a method for making patterned photoresists which comprises, (A) projecting an aerial image utilizing mid-UV light onto the surface of a photoresist having a contrast enhancement layer formed in situ thereon,
(B) stripping the resulting photobleached contrast enhancement layer from the surface of the photoresist, or simultaneously stripping the photobleached contrast enhancement layer, and
(C) developing the photoresist layer, where the contrast enhancement layer is formed by spin casting onto the surface of the photoresist, a mixture comprising the above-described spin castable CEL compositions.

Among the arylalkylnitrones which can be utilized in the practice of the present invention, there are included compounds such as
$\alpha$-cinnamyl-N-isopropylnitrone,
$\alpha$-cinnamyl-N-t-butylnitrone,   $\alpha$-cinnamyl-N-ethylnitrone,
$\alpha$-phenyl-N-t-butylnitrone, $\alpha$-anisyl-N-methylnitrone,
$\alpha$-anisyl-N-t-butylnitrone,
$\alpha$-(4-diethylaminophenyl)-N-methylnitrone,
$\alpha$-(4-cyanophenyl)-N-methylnitrone,
$\alpha$-(4-dimethylaminocinnamyl)-N-methylnitrone,
$\alpha$-p-tolyl-N-methylnitrone,
$\alpha$-(3,4-dimethylphenyl)-N-methylnitrone,
$\alpha$-phenyl-N-methylnitrone,   terephthalyl-bismethylnitrone,
$\alpha$-(4-phenylbutadienyl)-N-methylnitrone,
$\alpha$-(4-hydroxyphenyl)-N-methylnitrone,
$\alpha$-furyl-N-methylnitrone, $\alpha$-furyl-N-isopropylnitrone,
$\alpha$-(4-quinolinyl)-N-methylnitrone,
$\alpha$-(2-thiophenyl)-N-methylnitrone,
$\alpha$-(2-N-methylpyrrolyl)-N-methylnitrone, and
$\alpha$-(4-methoxycinnamyl)-N-methylnitrone.

Dialkylnitrones which can be utilized in the practice of the present invention include bisnitrones derived from glyoxyl and alkylhydroxylamines such as
N,N'-dimethylglyoxalnitrone,   N,N'-diethylglyoxalnitrone,
N,N'-di-n-propylglyoxalnitrone,
N,N'-diisopropylglyoxalnitrone,
N,N'-2-(1-hydroxybutyl)glyoxalnitrone, and
N,N'-dicyclohexylglyoxalnitrone.

Inert organic polymer binders which can be utilized in the practice of the present invention are polymers such as copolymers of styrene and allyl alcohol, polystyrene, poly(methylmethacrylate), poly($\alpha$-methylstyrene), poly(vinylpyrrolidone), polyphenyleneoxide, vinylpyridine/styrene copolymers, acrylonitrile/butadiene copolymers, butylmethacrylic/isobutyl methacrylate copolymers, cellulose propionate, ethyl cellulose, ethylene/vinyl acetate copolymers, polyacenaphthylene, poly(benzylmethacrylate), poly(ethyleneoxide), poly(2-hydroxyethylmethacrylate), poly(4-isopropylstyrene), polyallylalcohol, poly(hydroxypropylmethylcellulose), poly(methylcellulose), and poly(hydroxypropylcellulose).

The term "inert" with respect to the above-shown organic polymer binders refers to the ability of the binder to form a photobleachable layer with the alkylnitrone as previously defined and an in situ CEL on the surface of the photoresist which, upon being photobleached, can be readily removed from the surface of the photoresist by stripping with a solvent. The stripping of the photobleached CEL can occur as a separate step prior to developing the photoresist, or it can occur simultaneously with the development of the photoresist in instances where water soluble inert binder is used as part of an aqueous CEL spin castable mixture. In instances where an organic solvent is used in the spin castable CEL mixture and stripping prior to development is required, any suitable solvent can be utilized to effect the removal of the photobleached CEL from the photoresist. However, it is preferred to utilize an organic solvent such as toluene, trichloroethylene, chlorobenzene or mixtures with anisole.

As taught in copending application, Ser. No. 691,829, filed Jan. 16, 1985 of P. R. West, for "Photolithographic Stripping Method" which is incorporated herein by reference and assigned to the same assignee as the present invention, organic solvents can be used to effect the removal of photobleached CEL derived from spin castable mixtures containing organic solvent. For example, a mixture of toluene and anisole can be employed as well as stripping with toluene in the form of a fine mist.

In order that those skilled in the art will be better able to practice the invention, the following examples are given by way of illustration and not by way of limitation. All parts are by weight.

EXAMPLE 1

A solution of t-butylhydroxylamine (1.0 g, 11 mmole) and p-anisaldehyde (1.5 g, 11 mmole) in 20 mL of benzene was refluxed through a Dean-Stark trap for 18 hours. One drop of methanesulfonic acid was then added and refluxing was continued for an additional two hours. The reaction mixture was then washed with saturated aqueous sodium bicarbonate and the benzene removed under reduced pressure. The residue was recrystallized from petroleum ether. Based on the method of preparation, there was obtained 0.8 g (3.9 mmole) or a 35% yield of the α-anisyl-N-t-butylnitrone having a melting point of 90°-1° C.

An ethylbenzene solution was prepared consisting of 8% by weight of α-cinnamyl-N-t-butylnitrone (synthesized in the same fashion as in the above example) and 8% by weight of an allyl alcohol/styrene copolymer. The solution was spin-coated at 4000 rpm/25 seconds onto silicon wafers coated with 1.4 micron thick AZ 5214 photoresist. The resulting coated wafers were printed on a Suss MJB-56 aligner in the UV-300 mode. The resulting irradiated wafers were stripped by immersion in trichloroethylene for 30 seconds and then were developed with Shipley 351 developer utilizing a proportion of 1 part of developer and 5 parts of water. There was resolved 1.5 micron/patterns which were obtained after a 36-second exposure. The lines were characterized by having vertical wall profiles indicating effective contrast enhancement.

EXAMPLE 2

A mixture of 5 g (60 mmole) of methylhydroxylamine hydrochloride and 8 g (61 mmole) of cinnamaldehyde were combined in 25 mL of anhydrous methanol and stirred for 15 minutes at room temperature. The solvent was then removed at reduced pressure and replaced with 50 mL of methylene chloride. The solution was washed with 75 mL of saturated aqueous sodium bicarbonate followed by washing with a brine solution. After drying over anhydrous magnesium sulfate, the solvent was removed under reduced pressure. The solid residue was titurated with ether, filtered and dried. There was obtained 7.2 g (45 mmole or 74% yield) of α-cinnamyl-N-methylnitrone having a melting point of 85°-6° C.

A solution of 8% by weight of α-cinnamyl-N-methylnitrone and 8% by weight of an allyl alcohol/styrene copolymer in ethylbenzene was spin-coated at 4000 rpm for 25 seconds onto silicon wafers coated with 1.4 micron-thick AZ5214 resist and a 800A coating of poly vinyl alcohol. The resulting composites were contact printed on a Suss MJB-56 aligner in the UV 300 mode. Vertical wall 1.5 micron lined/spaced patterns were resolved with a 40 second exposure.

Similar results were obtained with contrast enhancement compositions utilizing α-cinnamyl-N-isopropylnitrone and α-cinnamyl-N-ethylnitrone.

EXAMPLE 3

A mixture of 7.5 g (100 mmole) of nitroethane, 0.25 g of 9% Pd/C and 80 cc of methanol was charged with 50 psi of hydrogen and stirred until 2 equivalents of hydrogen were taken up. The reaction mixture which contained the ethylhydroxylamine was filtered and to it was added 7.0 g (45 mmole) of 40% aqueous glyoxal. After stirring for 0.5 hours at room temperature the methanol was removed under reduced pressure and the solid residue was triturated with ether. The product was filtered and dried to give 3.44 g (53% yield) of bis-nitrone having a melting point of 157°-158° C.

A solution of 4% by weight of the ethylglyoxal nitrone and 4% by weight of an allyl alcohol/styrene copolymer in chloroform was spun at 4000 rpm for 25 seconds onto a quartz disc. The resulting film was exposed to 313 nm radiation (about 2.7 mw/cm$^2$) and film transmittance was followed as a function of time. The initial transmittance of the film was 0% T. The transmittance after bleaching was 93% T. This bleaching data is consistant for a material useful in contrast enhanced photolithography.

EXAMPLE 4

A solution of 4.3% by weight of ethylglyoxal nitrone and 8.7% by weight of a polyvinylalcohol (88% hydrolyzed) in distilled water was spun at 3000 rpm for 30 seconds onto a silicon wafer coated with 1.4 micron thick AZ 5214 resist without a barrier coat. The resulting wafer was printed on a Suss MJB-56 aligner in the UV-300 mode. The resulting irradiated wafer was then directly developed with Shipley 351 developer utilizing a proportion of 1 part of developer and 5 parts water. There was resolved 1.5 micron lined/spaced patterns which were characterized by having vertical wall profiles indicating effective contrast enhancement.

EXAMPLE 5

A solution of 3.1% by weight of α-cinnamyl-N-isopropylnitrone and 7.5% by weight of a polyvinylalcohol (88% hydrolyzed) in 80/20 by weight water/methanol was spun onto a silicon wafer coated with 1.4 micron thick AZ 5214 resist without a barrier coat. The resulting wafer was printed on a Suss MJB-56 aligner in the UV-300 mode. The irradiated wafer was then directly developed with Shipley 351 developer as in Example 4. The resulting patterns were characterized by having vertical profiles indicating effective contrast enhancement.

Although the above examples are directed to only a few of the very many variables which can be utilized in the practice of the present invention, it should be understood that the present invention is directed to a much broader variety of arylalkylnitrones, dialkylnitrones, and inert organic polymer binders and the use of such photolithographic compositions in water, organic solvent, or mixtures thereof, to treat silicon wafers. Some of the alkylnitrones which can be used in the practice of the invention are shown further by the following formula:

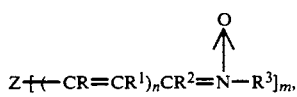

where Z is an organic group selected from the class consisting of

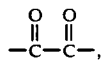

a $C_{(4-20)}$ aromatic heterocyclic radical having one or more O, N, or S atoms, or a mixture of such heterocyclic atoms, a $C_{(6-20)}$ aromatic hydrocarbon radical, and a $C_{(6-20)}$ aromatic hydrocarbon radical substituted with one or more nuclear bound neutral radicals, R, $R^1$, and $R^2$ are monovalent radicals selected from the class consisting of hydrogen, $C_{(1-10)}$ alkyl $C_{(1-10)}$ alkyl substituted with neutral radicals, $C_{(6-20)}$ aromatic hydrocarbon, and $C_{(6-20)}$ aromatic hydrocarbon substituted with neutral radicals, $R^3$ is a member selected from the class consisting of $C_{(1-10)}$ alkyl and $C_{(1-10)}$ alkyl substituted with neutral radicals, n is a whole number having a value of 0 to 2 inclusive, and m is an integer having a value of 1 or 2, and when m is 1, Z is monovalent, and when m is 2, Z is divalent.

What is claimed and sought to be protected by Letters Patent of the United States is as follows

1. A composite useful for making patterned photoresists using UV irradiation, comprising a photoresist and a contrast enhancement layer formed in situ thereon, where the contrast enhancement layer is made from a spin castable mixture comprising, by weight,
    (A) 100 parts of solvent,
    (B) 1 to 30 parts of an inert organic polymer binder, and
    (C) 1 to 30 parts of
        (i) an arylalkylnitrone selected from the group consisting of
            α-cinnamyl-N-isopropylnitrone,
            α-cinnamyl-N-t-butylnitrone, α-cinnamyl-N-ethylnitrone,
            α-phenyl-N-t-butylnitrone, α-anisyl-N-methylnitrone,
            α-anisyl-N-t-butylnitrone,
            α-(4-diethylaminophenyl)-N-methylnitrone,
            α-(4-cyanophenyl)-N-methylnitrone,
            α-(4-dimethylaminocinnamyl)-N-methylnitrone,
            α-p-tolyl-N-methylnitrone,
            α-(3,4-dimethylphenyl)-N-methylnitrone,
            α-phenyl-N-methylnitrone, terephthalyl-bismethylnitrone,
            α-(4-phenylbutadienyl)-N-methylnitrone,
            α-(4-hydroxyphenyl)-N-methylnitrone,
            α-furyl-N-methylnitrone, α-furyl-N-isopropylnitrone,
            α-(4-quinolinyl)-N-methylnitrone,
            α-(2-thiophenyl)-N-methylnitrone,
            α-(2-N-methylpyrrolyl)-N-methylnitrone, and
            α-(4-methoxycinnamyl)-N-methylnitrone,
        (ii) a dialkylnitrone selected from the group consisting of bisnitrones derived from glyoxyl and alkylhydroxylamines, or
        (iii) an alkylnitrone of the formula,

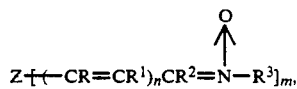

wherein Z is selected from the group consisting of

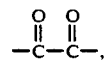

a $C_{(4-20)}$ aromatic heterocyclic radical having one or more O, N, or S atoms or a mixture of such heterocyclic atoms, a $C_{(6-20)}$ aromatic hydrocarbon radical, and a $C_{(6-20)}$ aromatic hydrocarbon radical substituted with one or more nuclear bound neutral radicals, wherein R, $R^1$, and $R^2$ are monovalent radicals selected from the group consisting of hydrogen, $C_{(1-10)}$ alkyl, $C_{(1-10)}$ alkyl substituted with neutral radicals, $C_{(6-20)}$ aromatic hydrocarbon, and $C_{(6-20)}$ aromatic hydrocarbon substituted with neutral radicals, wherein $R^3$ is selected from the group consisting of $C_{(1-10)}$ alkyl and $C_{(1-10)}$ alkyl substituted with neutral radicals, wherein n is a whole number having a value of 0 to 2 inclusive, and wherein m is an integer having a value of 1 or 2 with the proviso that, when m is 1, Z is monovalent, and when m is 2, Z is divalent.

2. The composite of claim 1 wherein the dialkylnitrone is selected from the group consisting of
    N,N'-dimethylglyoxalnitrone, N,N'-diethylglyoxalnitrone,
    N,N'-di-n-propylglyoxalnitrone, N,N'-diisopropylglyoxalnitrone,
    N,N'-2-(1-hydroxybutyl)glyoxalnitrone, and N,N'-dicyclohexylglyoxalnitrone.

3. A method for making patterned photoresists which comprises,
    (A) projecting an aerial serial image utilizing UV light onto the surface of a photoresist having a contrast enhancement layer formed in situ thereon,
    (B) stripping the resulting photobleached contrast enhancement layer from the surface of the photoresist, or simultaneously stripping such photo-bleached contrast enhancement layer, and
(C) developing the photoresist layer, where the contrast enhancement layer is formed by spin casting onto the surface of the photoresist, a mixture comprising, by weight,
(1) 100 parts of solvent,
(2) 1 to 30 parts of inert polymer binder, and
(3) 1 to 30 parts of
  (i) an arylalkylnitrone selected from the group consisting of
    α-cinnamyl-N-isopropylnitrone,
    α-cinnamyl-N-t-butylnitrone, α-cinnamyl-N-ethylnitrone,
    α-phenyl-N-t-butylnitrone, α-anisyl-N-methylnitrone,
    α-anisyl-N-t-butylnitrone,
    α-(4-diethylaminophenyl)-N-methylnitrone,
    α-(4-cyanophenyl)-N-methylnitrone,
    α-(4-dimethylaminocinnamyl)-N-methylnitrone,
    α-p-tolyl-N-methylnitrone,
    α-(3,4-dimethylphenyl)-N-methylnitrone,
    α-phenyl-N-methylnitrone, terephthalyl-bismethylnitrone,
    α-(4-phenylbutadienyl)-N-methylnitrone,
    α-(4-hydroxyphenyl)-N-methylnitrone,
    α-furyl-N-methylnitrone, α-furyl-N-isopropylnitrone,
    α-(4-quinolinyl)-N-methylnitrone,
    α-(2-thiophenyl)-N-methylnitrone,
    α-(2-N-methylpyrrolyl)-N-methylnitrone, and
    α-(4-methoxycinnamyl)-N-methylnitrone,
  (ii) a dialkylnitrone selected from the group consisting of bisnitrones derived from glyoxyl and alkylhydroxylamines, or
  (iii) an alkylnitrone of the formula,

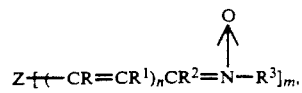

wherein Z is selected from the group consisting of

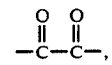

a $C_{(4-20)}$ aromatic heterocyclic radical having one or more O, N, or S atoms or a mixture of such heterocyclic atoms, a $C_{(6-20)}$ aromatic hydrocarbon radical, and a $C_{(6-20)}$ aromatic hydrocarbon radical substituted with one or more nuclear bound neutral radicals, wherein R, $R^1$, and $R^2$ are monovalent radicals selected from the group consisting of hydrogen, $C_{(1-10)}$ alkyl, $C_{(1-10)}$ alkyl substituted with neutral radicals, $C_{(6-20)}$ aromatic hydrocarbon, and $C_{(6-20)}$ aromatic hydrocarbon substituted with neutral radicals, wherein $R^3$ is selected from the group consisting of $C_{(1-10)}$ alkyl and $C_{(1-10)}$ alkyl substituted with neutral radicals, wherein n is a whole number having a value of 0 to 2 inclusive, and wherein m is an integer having a value of 1 or 2 with the proviso that, when m is 1, Z is monovalent, and when m is 2, Z is divalent.

4. A method in accordance with claim 3, where an aqueous spin castable mixture is used.

5. A method in accordance with claim 3, where the inert polymer binder is water soluble.

6. A method in accordance with claim 3, where the solvent in the mixture is an organic solvent.

7. The method of claim 3 wherein the dialkylnitrone is selected from the group consisting of
N,N'-dimethylglyoxalnitrone, N,N'-diethylglyoxalnitrone,
N,N'-di-n-propylglyoxalnitrone, N,N'-diisopropylglyoxalnitrone,
N,N'-2-(1-hydroxybutyl)glyoxalnitrone,
and N,N'-dicyclohexylglyoxalnitrone.

* * * * *